(12) United States Patent
Uchida et al.

(10) Patent No.: US 7,382,013 B2
(45) Date of Patent: Jun. 3, 2008

(54) DIELECTRIC THIN FILM, DIELECTRIC THIN FILM DEVICE, AND METHOD OF PRODUCTION THEREOF

(75) Inventors: Kiyoshi Uchida, Chuo-ku (JP); Kenji Horino, Chuo-ku (JP); Hitoshi Saita, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/236,724

(22) Filed: Sep. 28, 2005

(65) Prior Publication Data

US 2006/0071263 A1  Apr. 6, 2006

(30) Foreign Application Priority Data

Sep. 30, 2004  (JP) ............................. 2004-287971

(51) Int. Cl.
*H01L 29/94* (2006.01)

(52) U.S. Cl. ...................... 257/310; 257/295; 257/410; 257/411; 257/E27.104; 257/E29.015; 257/E29.132; 257/E29.164; 257/E29.272

(58) Field of Classification Search ................ 257/303, 257/295, 310, 410, 411, E27.104, E29.015, 257/E29.132, E29.164, E29.272
See application file for complete search history.

(56) References Cited

U.S. PATENT DOCUMENTS 4,447,549 A * 5/1984 Masujima et al. .......... 501/138
6,049,103 A * 4/2000 Horikawa et al. .......... 257/303

FOREIGN PATENT DOCUMENTS

JP  A 7-17713  1/1995
JP  A 8-198669  8/1996

* cited by examiner

*Primary Examiner*—Minh-Loan T. Tran
*Assistant Examiner*—Benjamin Tzu-Hung Liu
(74) *Attorney, Agent, or Firm*—Oliff & Berridge, PLC

(57) ABSTRACT

To provide a dielectric thin with a high dielectric constant, a low leakage current, and stable physical properties and electrical properties and to provide a thin film capacitor or other thin film dielectric device with a high capacitance and high reliability and a method of production of the same, a dielectric thin film containing oxides such as barium strontium titanate expressed by the formula $(Ba_xSr_{(1-x)})_aTiO_3$ ($0.5 < x \leq 1.0$, $0.96 < a \leq 1.00$) and having a thickness of not more than 500 nm and a method of production of a thin film dielectric device including a step of annealing the dielectric thin film in an atmosphere of an oxidizing gas after forming a dielectric thin film on a conductive electrode.

9 Claims, 4 Drawing Sheets

DIELECTRIC THIN FILM, DIELECTRIC THIN FILM DEVICE, AND METHOD OF PRODUCTION THEREOF

BACKGROUND OF THE INVENTION

1. Field of the Invention

The present invention relates to a dielectric thin film, a thin film dielectric device, and a method of production of the same, more particularly relates to a dielectric thin film, thin film dielectric device, and method of production of the same giving a high dielectric constant and able to reduce the leakage current.

2. Description of the Related Art

In recent years, in the field of electronic devices, along with the higher densities and integrations of electronic circuits, increasingly smaller size, thinner layers, and greater capacitance are being demanded from the circuit devices required for various electronic circuits such as capacitors.

To reduce the size and thickness of layers and increase the capacitance of capacitors, dielectric materials with high dielectric constants are being used. As these dielectric materials, lead titanate ($PbTiO_3$), lead zirconium titanate (PZT), barium titanate ($BaTiO_3$: BT), stronium titanate ($SrTiO_3$: ST), barium strontium titanate ($BaSrTiO_3$: BST), and other perovskite-type oxides may be mentioned.

Among these, barium titanate (BT), strontium titanate (ST), and barium strontium titanate (BST) have high dielectric constants and long life time and are superior in properties. In particular, the full solid solution of barium titanate (BT) and strontium titanate (ST), barium strontium titanate (BST), can be adjusted in Curie temperature by changing the ratio between BT and ST and can be made a paraelectric substance having a high dielectric constant even at room temperature.

Further, such a capacitor, for example, a capacitor device used as a circuit device essential for various electronic circuits, sometimes has to be made a thin film device. Therefore, the BT, ST, and BST used as the dielectric layers of the capacitor device also have to be made thinner to be made dielectric thin films. When making the above dielectric materials the dielectric thin film, it is desirable that the dielectric constant be high and the leakage current be reduced.

However, in such a dielectric thin film, achievement of both a high dielectric constant and low leakage current is generally considered difficult. To solve this problem, the method of doping an additive in the BST has been performed. For example, Japanese Unexamined Patent Publication (Kokai) No. 8-198669 proposes an Er-doped BST comprised of BST doped with erbium (Er). However, when making the BT, ST, BST, or other dielectric a thin one of less than about 500 nm, it is difficult to uniformly add the additive Er and the distribution of the additive becomes varied, so it is difficult to obtain stable characteristics.

Further, Japanese Unexamined Patent Publication (Kokai) No. 7-17713 discloses a dielectric thin film comprised of a perovskite type oxide expressed by the chemical formula $(Ba,Sr)_yTiO_3$ where $1.00<y\leq1.20$. A higher dielectric constant and a lower leakage current are achieved. In the examples of this document, the composition of BST forming the dielectric thin film is made $(Ba_{0.5}, Sr_{0.5})_yTiO_3$ where the ratios of barium and strontium are equal and the value of "y" is made $1.00<y\leq1.20$. However, when making the composition of BST the above range of composition, both a high dielectric constant and low leakage current cannot be said to be sufficiently achieved yet. In particular, when making a dielectric thin film even thinner (for example, when making it less than 100 nm), both the dielectric constant and the low leakage current characteristic cannot be said to be sufficient.

SUMMARY OF THE INVENTION

An object of the present invention is to provide a dielectric thin film with a high dielectric constant, low leakage current, a stable physical properties and electrical properties. Further, the present invention has as its object the provision of a thin film capacitor or other thin film dielectric device using such a dielectric thin film and having a high capacitance and high reliability and a method of production of the same.

The inventors of the present invention discovered that it is possible to achieve the above objects without using an additive other than oxides expressed by the formula $(Ba_xSr_{(1-x)})_aTiO_3$ by limiting the composition ratio of a dielectric thin film containing said oxides and thereby completed the present invention.

That is, the dielectric thin film according to the present invention is a dielectric thin film containing oxides such as barium strontium titanate (BST) expressed by the formula $(Ba_xSr_{(1-x)})_aTiO_3$, characterized in that the symbols "x" and "a" shown in the formula are
$0.5<x\leq1.0$
$0.96<a\leq1.00$ and
the thickness is not more than 500 nm.

The present invention provides a dielectric thin film containing oxides expressed by the formula $(Ba_xSr_{(1-x)})_aTiO_3$ characterized in that the thickness of the dielectric thin film is not more than 500 nm, the composition of said formula is one where the barium is greater than the strontium, and the amount of the elements making up the A site is the same as or slightly smaller than the amount of the elements making up the B site. By making the composition of the formula such a range of composition, it is possible to obtain a dielectric thin film with a high dielectric constant, a low leakage current, and stable physical properties and electrical properties.

Further, in the present invention, since substantially no additive other than said formula is used, there is substantially no problem of variations in the distribution of the additives which easily occur when using additives. Note that in the present specification, the $(Ba_xSr_{(1-x)})_aTiO_3$ ($0.5<x\leq1.0$, $0.96<a\leq1.00$) does not strictly limit the stoichiometric composition. The amount of oxygen (O) may deviate somewhat from the stoichiometric composition of the above formula.

The dielectric thin film according to the present invention preferably has a dielectric constant of at least 450 and a leakage current density at the time of an applied electric field strength of 100 kV/cm of not more than $1\times10^{-6}$ A/cm².

The dielectric thin film according to the present invention preferably has an "a" of the above formula of $0.96<a<1.00$, more preferably $0.98\leq a<1.00$.

The thin film dielectric device according to the present invention is characterized by being comprised of a substrate on which a bottom electrode, dielectric thin film, and top electrode are successively formed and by said dielectric thin film being a dielectric thin film according to the above invention.

Alternatively, the thin film dielectric device of the present invention is characterized by being comprised of a substrate on which a dielectric thin film and internal electrode thin film are alternately stacked in a plural layers and by said dielectric thin film being a dielectric thin film according to the above invention.

As specific examples of the thin film dielectric device, while not particularly limited to these, for example, a thin film capacitor, multilayer thin film capacitor, inorganic EL device, DRAM capacitor, etc. may be mentioned.

Further, thin film dielectric device of the invention is possible to form it directly on a semiconductor substrate to obtain a thin film dieletric device mounted on a substrate.

The thin film dielectric device of the present invention may be made a single layer device or a multilayer device. A single layer device is comprised of a substrate on which a bottom electrode, dielectric thin film, and top electrode are successively formed. On the other hand, a multilayer device is comprised of a substrate on which a bottom electrode is formed, on which bottom electrode a dielectric thin film and internal electrode thin film are alternately stacked in a plural layers, and on which a top electrode is formed.

The method of production of a thin film dielectric device of the present invention is characterized by including a step of forming the dielectric thin film of the present invention on a conductive electrode by sputtering.

Here, the "conductive electrode" means said bottom electrode or said internal electrode thin film. In the method of production of a thin film dielectric device of the present invention, said dielectric thin film is formed by sputtering, so the control of the composition is good and it is possible to form a dielectric thin film with stable physical properties and electrical properties at a fast speed on a large area substrate.

The method of production of a thin film dielectric device according to the present invention preferably further comprises performing said sputtering in an oxidizing gas atmosphere of a mixture of argon gas and oxygen gas and the percent of the oxygen gas in the oxidizing gas is more than 0 vol % and not more than 50 vol %.

In the present invention, it is preferable to perform the sputtering in an oxidizing gas atmosphere. By doing this, it is possible to effectively prevent oxygen defect from the crystalline structure of oxides such as BST.

The method of production of a thin film dielectric device according to the present invention preferably further includes the step of annealing the dielectric thin film in an atmosphere of an oxidizing gas.

According to the present invention, by limiting the composition ratio and making the thickness not more than 500 nm in oxides expressed by the formula $(Ba_xSr_{(1-x)})_aTiO_3$, it is possible to provide a dielectric thin film and a thin film dielectric device with a high dielectric constant, a low leakage current, and stable physical properties and electrical properties.

Further, according to the method of production of a thin film dielectric device of the present invention, the dielectric thin film of the present invention is formed by sputtering, so it is possible to provide a thin film capacitor or other thin film dielectric device with a high capacitance and a high reliability.

BRIEF DESCRIPTION OF THE DRAWINGS

Below, the present invention will be explained based on the illustrated embodiments.

DESCRIPTION OF THE PREFERRED EMBODIMENTS

In the present embodiment, the explanation will be given illustrating a thin film dielectric device 1 formed with a single layer of a dielectric thin film of the invention.

Thin Film Dielectric Device 1

Figure 1:
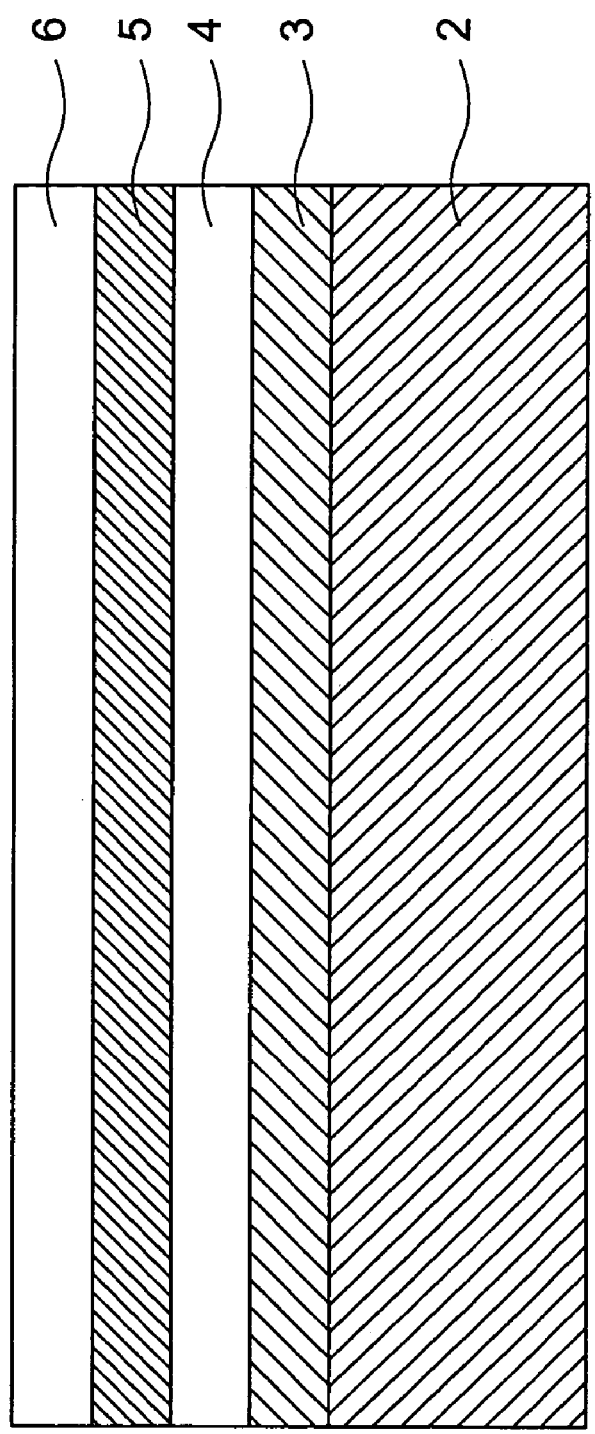
FIG. 1 is a cross-sectional view of a thin film dielectric device according to an embodiment of the present invention.

As shown in FIG. 1, the thin film dielectric device 1 according to an embodiment of the present invention is comprised of a substrate 2 on which an insulating film 3, a bottom electrode 4, a dielectric thin film 5, and a top electrode 6 are successively formed.

The substrate 2 is a substrate for supporting the bottom electrode, dielectric thin film, and top electrode. It is sufficient to be one with a high chemical stability and a low generation of stress and is comprised of ceramic, glass, silicon, etc. In the present embodiment, the substrate 2 is comprised of a silicon single crystal substrate.

The insulating film 3 is a silicon oxide film ($SiO_2$) and is formed by thermal oxidation of the silicon single crystal substrate.

The material forming the bottom electrode 4 is not particularly limited so long as it is a material having conductivity. For example, platinum (Pt), gold (Au), silver (Ag), iridium (Ir), ruthenium (Ru), cobalt (Co), nickel (Ni), iron (Fe), copper (Cu), aluminum (Al), or another metal or an alloy thereof, gallium arsenide (GaAs), gallium phosphide (GaP), indium phosphide (InP), silicon carbide (SiC), or another conductive semiconductor, indium tin oxide (ITO), zinc oxide (ZnO), tin oxide ($SnO_2$), indium oxide ($In_2O_3$), iridium dioxide ($IrO_2$), ruthenium dioxide ($RuO_2$), rhenium trioxide ($ReO_3$), LSCO ($La_{0.5}Sr_{0.5}CoO_3$), or another metal oxide conductor may be used. The thickness of the bottom electrode 4 is not particularly limited, but is preferably 10 to 1000 nm, more preferably 50 to 800 nm or so.

To secure bonding of the substrate 2 and bottom electrode 4, it is sufficient to provide a buffer layer between the insulating film 3 formed on the substrate 2 and the bottom electrode 4. As the buffer layer, for example, $TiO_x$/Si, $TiO_x$/$SiO_2$/Si, TaN/Si, etc. may be mentioned. Note that "/Si" means the substrate side. As the method for forming the adhesion layer, it is possible to form it by physical vapor deposition (PVD), chemical vapor deposition (CVD), or other vapor deposition method. These may be suitably selected in accordance with the deposited material.

The top electrode 6 may be comprised of a material similar to the bottom electrode 4. Further, the thickness should be similar too.

The dielectric thin film 5 contains oxides expressed by the formula $(Ba_xSr_{(1-x)})_aTiO_3$ such as barium strontium titanate (BST). The BST has barium and strontium both occupying the A site of the perovskite structure and is a total solid solution forming a solid solution by a composition of $0 \leq x \leq 1.0$.

The symbol "x" showing the ratio in the above formula is $0.5 < x \leq 1.0$, preferably $0.6 \leq x \leq 0.9$, more preferably $0.65 \leq x \leq 0.85$. That is, in the present invention, the ratio of the barium in the formula is made greater than the ratio of the strontium. Here, if "x" is too small, the result is close to the properties of strontium titanate and the dielectric constant tends to decline.

The symbol "a" showing the ratio in the above formula is $0.96 < a \leq 1.00$, preferably $0.96 < a < 1.00$, more preferably $0.98 \leq a < 1.00$. If "a" is too large, the leakage current density tends to become larger, while if it is too small, the dielectric constant tends to decline.

The thickness of the dielectric thin film 5 is not more than 500 nm, preferably not more than 300 nm, more preferably not more than 100 nm. If the thickness of the dielectric thin film 5 is too great, reduction of the size of the device will tend to become difficult. The lower limit of the thickness is not particularly limited, but considering securing the minimum limit grain size, the flatness of the substrate, and the in-plane uniformity of the thickness, it is normally about 40 nm.

The present invention is characterized in the point that in the dielectric thin film containing oxides expressed by the formula $(Ba_xSr_{(1-x)})_aTiO_3$, such as the barium strontium titanate (BST), the thickness of the dielectric thin film is made not more than 500 nm and the symbols "x" and "a" in the formula $(Ba_xSr_{(1-x)})_aTiO_3$ are in the above ranges. That is, the present invention is characterized in that the composition of the formula is one where the barium is greater than the strontium and the amount of the elements forming the A site is the same as or slightly smaller than the amount of the elements forming the B site. By doing this, it is possible to obtain a dielectric thin film with a high dielectric constant, a low leakage current, and stable physical properties and electrical properties.

The dielectric constant of the dielectric thin film 5 is preferably at least 450, more preferably at least 480. The leakage current density at the time of an applied electric field strength of 100 kV/cm is preferably not more than $1 \times 10^{-6}$ $A/cm^2$, more preferably not more than $1.5 \times 10^{-7}$ $A/cm^2$. In the present embodiment, the dielectric thin film of the present invention is used as the dielectric thin film 5, so it is possible to achieve a high dielectric constant and a low leakage current.

The thin film dielectric device 1 of the present embodiment is produced by successively forming on the thermally oxidized silicon single crystal substrate a bottom electrode, dielectric thin film, and top electrode by sputtering. Below, the method of production will be explained in more detail.

Method of Production of Thin Film Dielectric Device 1

First, as the substrate 2, a silicon single crystal substrate was used. The silicon single crystal substrate was thermally oxidized to form an insulating film 3 (silicon oxide film: $SiO_2$) on the surface of the silicon single crystal substrate. The thermal oxidation method is not particularly limited, but dry oxidation of the silicon single crystal substrate performed under a high temperature in an oxidizing gas atmosphere of oxygen gas, nitrous oxide gas, etc., wet oxidation in a steam atmosphere, etc. may be mentioned.

Next, a bottom electrode 4 is formed on the silicon single crystal substrate formed with the silicon oxide film by thermal oxidation to prepare a stack with the bottom electrode. In the present embodiment, as the material forming the bottom electrode 4, it is possible to use the above-mentioned material having conductivity. Further, as the method of forming the bottom electrode 4, sputtering is preferable. Specifically, the sputtering is performed using as a target the above material having conductivity.

Next, a dielectric thin film 5 is formed on the bottom electrode 4 of the stack with the bottom electrode to prepare a stack with the dielectric thin film. In the present embodiment, the dielectric thin film 5 is a film of BST by sputtering.

The sputtering is performed by heating the stack with the bottom electrode, preferably in an oxidizing gas atmosphere under reduced pressure using oxides expressed by the formula $(Ba_xSr_{(1-x)})_aTiO_3$, such as BST as a target.

The dielectric thin film 5 is formed on the bottom electrode 4 in the present embodiment by sputtering, so it is possible to grow a dielectric thin film of $(Ba_xSr_{(1-x)})_aTiO_3$ of a perovskite structure superior in control of the composition on a large area substrate at a fast speed.

The substrate heating temperature when forming a film by sputtering is preferably 400 to 800° C., more preferably 450 to 750° C. If the heating temperature is too low, the denseness and uniformity of the dielectric thin film formed will tend to decline, while if too high, the crystal growth will tend to occur unevenly.

The film forming speed is preferably 1 to 10 nm/min, more preferably 2 to 8 nm/min. The film forming speed can be controlled by the input power and film forming pressure etc. If the film forming speed is too fast, the leakage current density will tend to become larger, while if too slow, the production time will tend to become longer and the production efficiency to fall.

Note that as other conditions when forming a film by sputtering, the film forming pressure is preferably 0.1 to 10 Pa, more preferably 0.3 to 5 Pa, and the input power is preferably 0.5 to 5 $W/cm^2$, more preferably 1.0 to 5 $W/cm^2$.

Further, the sputtering is preferably performed in an oxidizing gas atmosphere. The oxidizing gas is preferably a mixed gas of argon gas and oxygen gas. In the oxidizing gas, the ratio of the oxygen gas is greater than 0 vol % and not more than 50 vol %, more preferably at least 10 vol % and not more than 35 vol %. When sputtering in an oxidizing gas atmosphere, oxides such as BST will be grown in an oxidizing atmosphere, so it is possible to effectively prevent oxygen defect from the crystalline structure of the oxides.

When forming the dielectric thin film 5 containing oxides by sputtering, as the target used, it is possible to use a $(Ba_xSr_{(1-x)})_aTiO_3$ target made the desired composition in advance or targets separating the ingredients such as a $BaTiO_3$ target and $SrTiO_3$ target. When using targets separating the ingredients such as a $BaTiO_3$ target and $SrTiO_3$ target, it is preferable to sputter the two targets simultaneously. The ratios of the two targets are preferably also adjusted to give the desired composition.

In the present embodiment, after forming the dielectric thin film 5 by sputtering, it is preferable to anneal the stack with the dielectric thin film in an oxidizing gas atmosphere. By annealing it, the oxides such as BST in the dielectric thin film formed by the sputtering grows in particle size and crystallization proceeds in the substrate planar direction, so the dielectric constant can be improved. Further, in the present embodiment, when annealing, the annealing is preferably performed in an oxidizing atmosphere. By annealing in an oxidizing gas atmosphere in this way, it is possible to effectively prevent oxygen defect from the crystalline structure of the oxides.

The annealing temperature should be a temperature higher than the temperature of the sputtering. While not particularly limited, it is preferably 600 to 1000° C., more preferably 800 to 1000° C. Further, the temperature holding time during the annealing is preferably 10 to 120 min, more preferably 30 to 60 min.

Next, a top electrode layer is formed on the dielectric thin film 5 of the stack with the dielectric thin film. In the present embodiment, the top electrode 6, in the same way as the bottom electrode, is preferably formed by sputtering using the above metal or alloy, conductive semiconductor, or metal oxide conductor as a target. In the present embodiment, as shown in FIG. 1, the top electrode 6 is formed on the entire top surface of the dielectric thin film 5.

A thin film dielectric device 1 of the present embodiment is produced in this way.

Note that the present invention is not limited to the above embodiment and can be modified in various ways in the scope of the invention.

For example, in the above embodiment, the thin film dielectric device 1 as shown in FIG. 1 was illustrated as a thin film dielectric device, but the thin film dielectric device according to the present invention is not limited to above-mentioned embodiment and may be any device having the above dielectric thin film. Further, thin film capacitor can be exemplified as above-mentioned thin film dielectric device.

Figure 2:
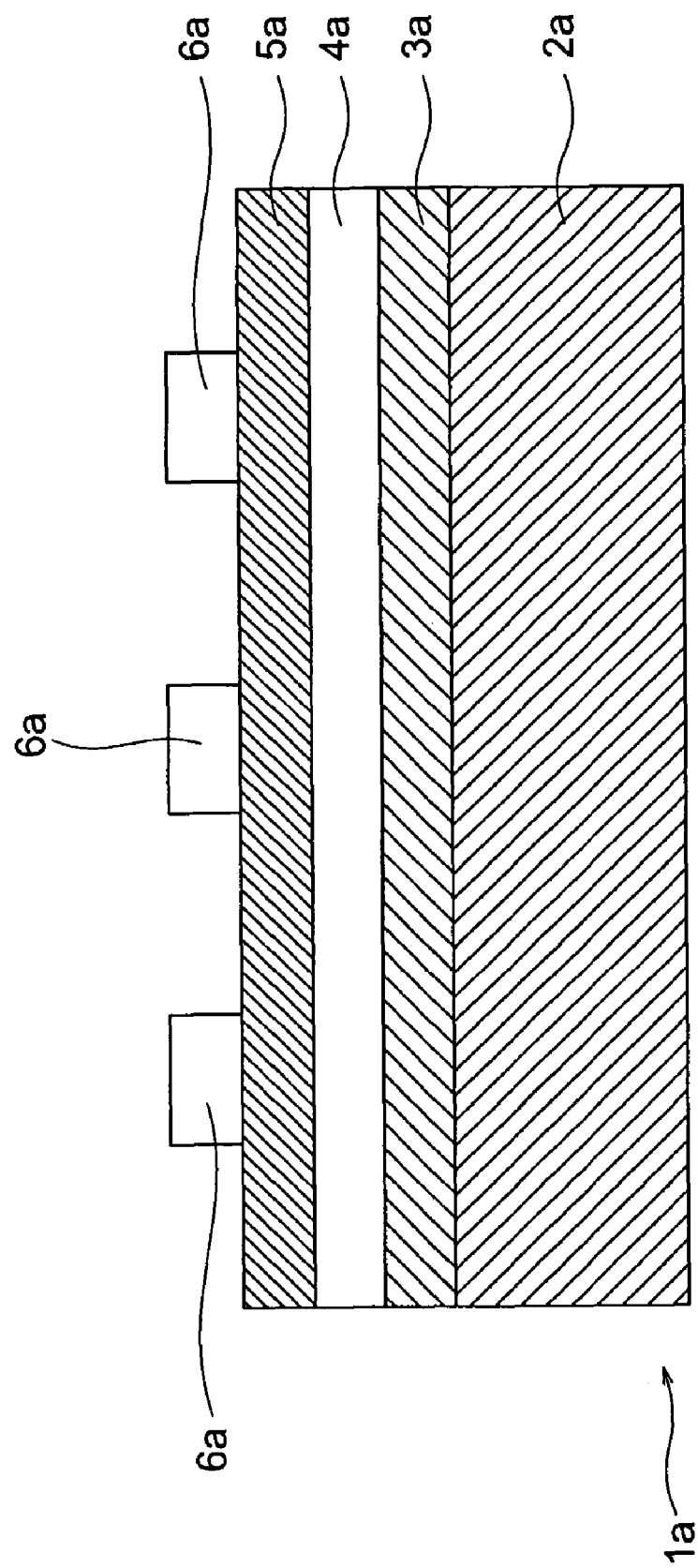
FIG. 2 is a cross-sectional view of a thin film dielectric device according to an example of the present invention.

Further, in the above embodiment, the top electrode 6 was formed on the entire top surface of the dielectric thin film 5 as shown in FIG. 1, but it may also be formed on part of the top surface of the dielectric thin film 5a as shown in FIG. 2. Note that as the method for forming the top electrode in patterns on the top surface of the dielectric thin film 5a as shown in FIG. 2, the method of using a mask may be mentioned for example. As the method of using a mask, the method of using a movable metal mask for patterning, the method of forming a mask by an etching resist and etching for patterning, etc. may be used.

Further, in the above embodiment, the thin film dielectric device was illustrated formed with a single layer of a dielectric thin film, but it is also possible to alternately stack pluralities of dielectric thin films and internal electrode thin films to form a multilayer structure. A multilayer structured thin film dielectric device is comprised of a substrate on which a bottom electrode is formed, on which bottom electrode pluralities of dielectric thin films and internal electrode thin films are alternately stacked, and on which a top electrode is formed. Note that the internal electrode thin films may be formed of the same material as the top electrode and bottom electrode explained above and should be made similar in thickness as well.

Further, in the above embodiment, a single thin film dielectric device was illustrated, but it is also possible to form it directly on a semiconductor substrate as a thin film dielectric device required for an integrated semiconductor circuit to obtain a dieletric device mounted on a substrate.

EXAMPLES

Below, the present invention will be explained based on more detailed examples, but the present invention is not limited to these examples.

First, as substrates, silicon single crystal substrates were prepared. The silicon single crystal substrates were thermally oxidized to form silicon oxide films ($SiO_2$) on the surfaces of the silicon single crystal substrates.

Next, platinum bottom electrodes were formed on the thermally oxidized silicon single crystal substrates. The platinum bottom electrodes were formed by sputtering using platinum (Pt) as targets. The thicknesses of the platinum bottom electrodes formed were 200 nm when measured by SEM observation.

Next, dielectric thin films were formed by sputtering using BST targets as the targets on the bottom electrodes of the stacks with the bottom electrodes. The compositions of the BST targets at the time of sputtering were adjusted to give compositions of the formula $(Ba_xSr_{(1-x)})_aTiO_3$ where "x" and "a" in the formula become the ratios shown in Table 1. The sputtering conditions were made a heating temperature of 550° C., an input power of 1.3 to 1.8 W/cm$^2$, an atmosphere by volume ratio of Ar:$O_2$=9:1 or 3:1, a film forming pressure of 0.3 to 4.0 Pa, and a film forming time of 20 to 30 min. The thicknesses of the dielectric thin films of the samples were measured by SEM observation and are shown in Table 1. The composition ratios of the formed dielectric thin films were analyzed by fluorescent X-ray analysis.

Next, the stacks with the dielectric thin films were annealed. The annealing conditions were an oxygen stream, a holding temperature of 900° C., and a temperature holding time of 30 min.

Finally, platinum top electrodes were formed on the dielectric thin films of the annealed stacks, whereby Samples 1 to 9 of thin film capacitor shown in FIG. 2 were obtained. Note that the platinum top electrodes were formed by sputtering using platinum (Pt) as targets, while the patterns were formed by the method of using metal masks. The thicknesses of the platinum bottom electrodes formed were measured by SEM observation and found to be 200 nm. The capacitor samples were evaluated by preparing a plural top electrodes in the range of 10×10 mm to obtain a plural thin film capacitors, measuring the dielectric constants and leakage current densities of the samples, and finding the mean values of the measurement results.

The dielectric constants and leakage current densities were measured for the samples of the thin film capacitors. The dielectric constants (no unit) were calculated from the electrostatic capacities measured for the thin film capacitor samples using a Digital LCR Meter (made by YHP, 4194A) under conditions of room temperature (25° C.) and a measurement frequency of 1 kHz (AC1Vrms) and the electrode areas and thicknesses of the thin film capacitor samples. The leakage current densities (unit: A/cm$^2$) were measured under conditions of an applied electric field strength of 100 kV/cm. Table 1 shows the results of measurement of the dielectric constants and leakage current densities of the samples.

TABLE 1

| Sample no. | | $(Ba_xSr_{(1-x)})_aTiO_3$ | | Film thickness | Annealing Temperature | Dielectric | Leakage current |
| --- | --- | --- | --- | --- | --- | --- | --- |
| | | x | a | nm | ° C. | constant | density (A/cm2) |
| 1 | Comp. Ex. | 0.73 | 0.96 | 78 | 900 | 270 | $2.3 \times 10^{-8}$ |
| 2 | Ex. | 0.72 | 0.98 | 97 | 900 | 489 | $6.8 \times 10^{-8}$ |
| 3 | Ex. | 0.73 | 0.99 | 93 | 900 | 498 | $4.3 \times 10^{-8}$ |
| 4 | Ex. | 0.71 | 1.00 | 94 | 900 | 531 | $1.1 \times 10^{-7}$ |

TABLE 1-continued

| Sample no. | | $(Ba_xSr_{(1-x)})_aTiO_3$ | | Film thickness | Annealing Temperature | Dielectric | Leakage current |
|---|---|---|---|---|---|---|---|
| | | x | a | nm | °C. | constant | density (A/cm2) |
| 5 | Comp. Ex. | 0.71 | 1.03 | 96 | 900 | 541 | $4.5 \times 10^{-6}$ |
| 6 | Comp. Ex. | 0.45 | 1.00 | 130 | 900 | 428 | $1.5 \times 10^{-7}$ |
| 7 | Comp. Ex. | 0.47 | 1.07 | 125 | 900 | 425 | $1.7 \times 10^{-7}$ |
| 8 | Comp. Ex. | 1.00 | 0.96 | 103 | 900 | 400 | $3.2 \times 10^{-7}$ |
| 9 | Ex. | 1.00 | 0.98 | 110 | 900 | 500 | $4.0 \times 10^{-7}$ |

Figure 3:
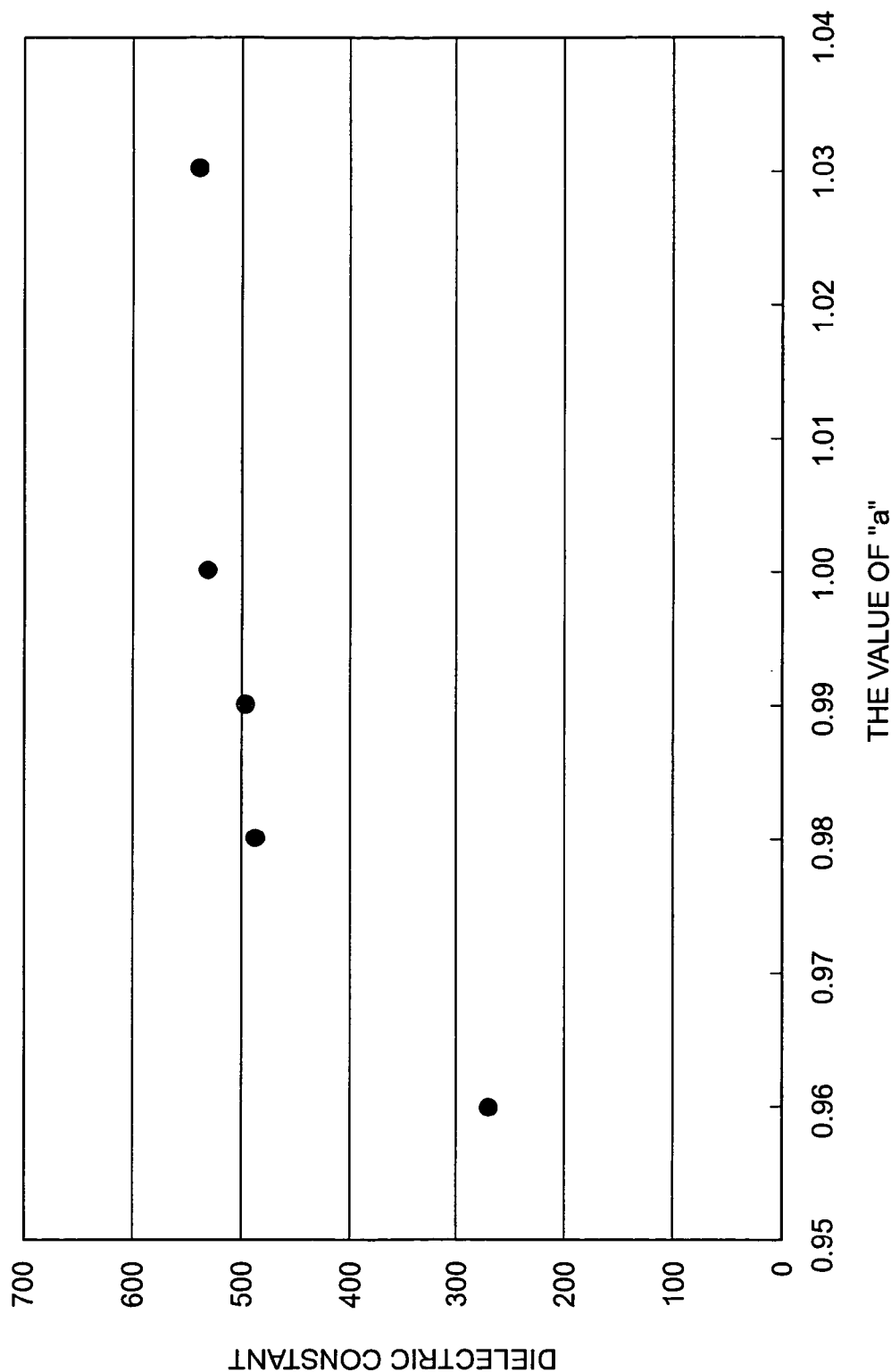
FIG. 3 is a graph of the relationship between the value of "a" in the formula $(Ba_xSr_{(1-x)})_aTiO_3$ and the dielectric constant.
Figure 4:
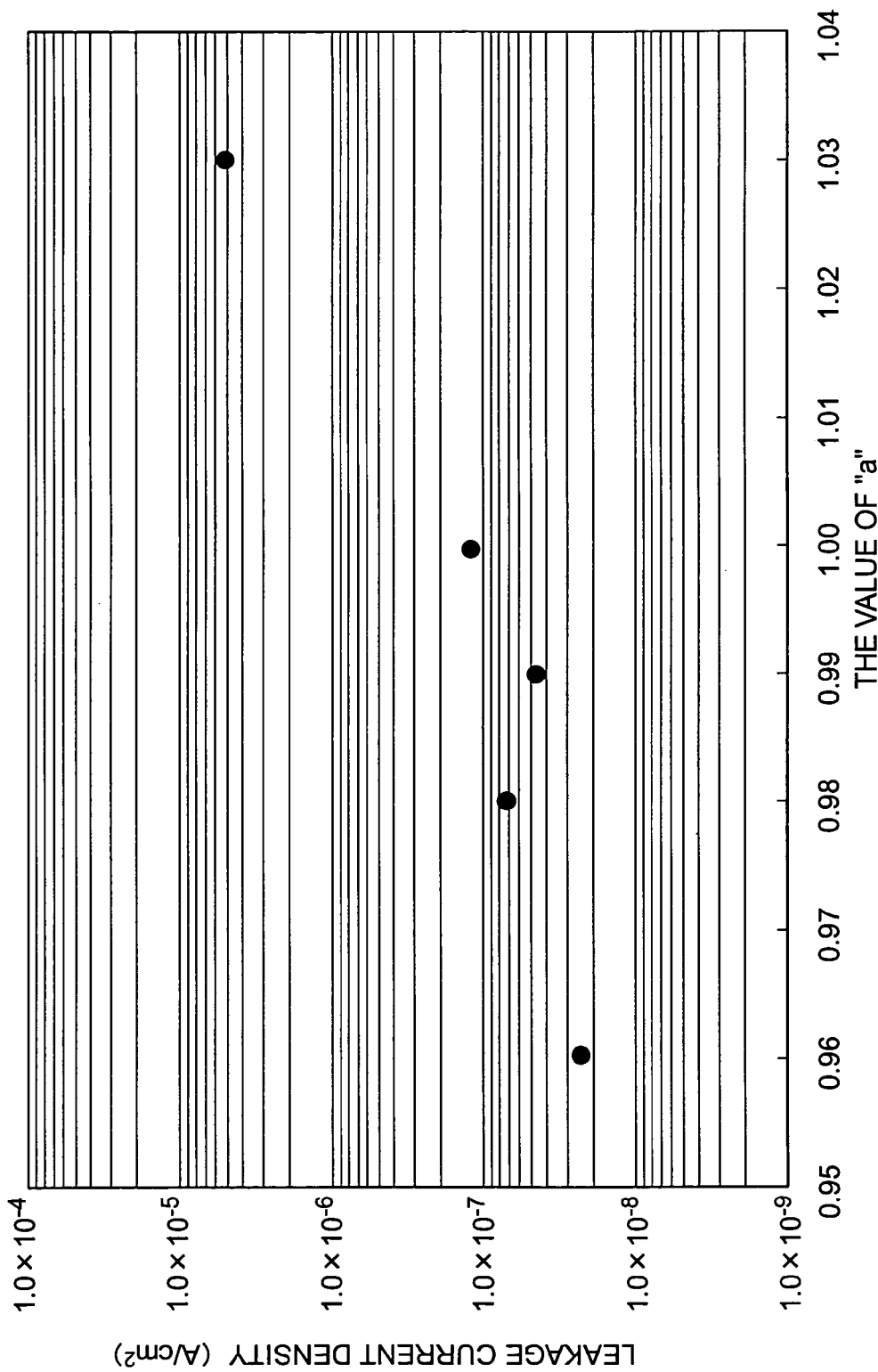
FIG. 4 is a graph of the relationship between the value of "a" in the formula $(Ba_xSr_{(1-x)})_aTiO_3$ and the leakage current density.

As shown in Table 1, in Samples 1 to 5 where the value of "x" in the composition $(Ba_xSr_{(1-x)})_aTiO_3$ is 0.71 to 0.73, it was confirmed as the value of "a" increases, the dielectric constant becomes larger. This is clear from FIG. 3 plotting the relationship between the value of "a" and the dielectric constant for Samples 1 to 5. Further, Sample 1 of the comparative example where a=0.96 had a low value of the dielectric constant of less than 300. From this result, it could be confirmed that to make the dielectric constant higher, it is preferable that a>0.96.

Further, regarding the leakage current density, Samples 1 to 4 having values of "a" not more than 1.00 had low values of not more than $2.0 \times 10^{-7}$ A/cm$^2$. Sample 5 of a comparative example having a value of "a" of 1.03 had a large value of the leakage current density of $4.5 \times 10^{-6}$ A/cm$^2$ or about 100 times the leakage current density of Sample 3. From this result, it could be confirmed that for keeping the leakage current density low, "a" is preferably not more than 1.00.

From the results of measurement of the dielectric constant and leakage current density of Samples 1 to 5, it was confirmed that in a composition where the barium is greater than the strontium where the value of x is $0.5 < x \leq 1.0$ in the composition $(Ba_xSr_{(1-x)})_aTiO_3$, the value of "a" is preferably $0.96 < a \leq 1.00$, more preferably $0.96 < a < 1.00$.

Further, Samples 6 and 7 of the comparative examples where $x \leq 0.5$, and "a"=1.00 and 1.07 respectively, had dielectric constants of lower values than Samples 2 to 4 of the examples of the present invention. Further, the leakage current density was a high value. That is, when "x" is without the range of the invention, i.e. $x \leq 0.5$, it was not possible to achieve both a high dielectric constant and a low leakage current density without regard to the value of "a". Sample 8 of the comparative example where x=1.0 and "a"=0.96 had a lower dielectric constant than Samples 2 to 4 of the examples of the present invention. On the other, Sample 9 of the example where x=1.0 and "a"=0.98 had a high dielectric constant as is the same with the samples 2 to 4 of the examples of the present invention. That is, when "x"=1.0 which is within the range of the invention, it was possible to achieve a high dielectric constant and low leakage current density only when "a" is 0.96<a. With this result, it was confirmed that to achieve a high dielectric constant and low leakage current density, it is preferable to make $0.5 < x \leq 1.0$ and $0.96 < a \leq 1.00$, that is, to make the composition of BST one with a greater amount of barium than strontium.

What is claimed is:

1. A dielectric thin film having a thickness comprising: oxides expressed by the formula $(Ba_xSr_{(1-x)})_aTiO_3$, wherein the symbols "x" and "a" shown in the formula are
   0.5<x<1.0
   0.96<a<1.00,
   the thickness is not more than 500 nm and
   said dielectric thin film is produced by annealing at a temperature of 800 to 1000° C. in an atmosphere of an oxidizing gas.

2. The dielectric thin film as set forth in claim 1, wherein said dielectric constant is 480 or more and a leakage current density at the time of an applied electric field strength of 100 kV/cm is not more than $1 \times 10^{-6}$ A/cm$^2$.

3. A thin film dielectric device comprised of a substrate on which a bottom electrode, dielectric thin film, and top electrode are successively formed, wherein said dielectric thin film is dielectric thin film as set forth in claim 2.

4. A thin film dielectric device comprised of a substrate on which a dielectric thin film and internal electrode thin film are alternately stacked in a plural layers, said thin film dielectric device wherein said dielectric thin film is a dielectric thin film as set forth in claim 2.

5. A method of production of a thin film dielectric device comprising a step of annealing the dielectric thin film in an atmosphere of an oxidizing gas after forming a dielectric thin film as set forth in claim 2 on a conductive electrode.

6. A thin film dielectric device comprised of a substrate on which a bottom electrode, dielectric thin film, and top electrode are successively formed, wherein said dielectric thin film is the dielectric thin film as set forth in claim 1.

7. A thin film dielectric device comprised of a substrate on which a dielectric thin film and internal electrode thin film are alternately stacked in a plural layers, said thin film dielectric device wherein said dielectric thin film is a dielectric thin film as set forth in claim 1.

8. A method of production of a thin film dielectric device comprising a step of annealing the dielectric thin film in an atmosphere of an oxidizing gas after forming a dielectric thin film as set forth in claim 1 on a conductive electrode.

9. The dielectric thin film as set forth in claim 1, wherein crystallization of the oxides proceeds in a substrate planar direction.

* * * * *